(12) United States Patent
Ribic

(10) Patent No.: US 11,239,812 B2
(45) Date of Patent: Feb. 1, 2022

(54) METHOD TO CONTROL THE DYNAMIC RANGE OF A SIGNAL

(71) Applicants: ISUNIYE LLC, Saratoga, CA (US); Zlatan Ribic, Vienna (AT)

(72) Inventor: Zlatan Ribic, Vienna (AT)

(73) Assignee: Isuniye LLC, Saratoga, CA (US)

( * ) Notice: Subject to any disclaimer, the term of this patent is extended or adjusted under 35 U.S.C. 154(b) by 58 days.

(21) Appl. No.: 16/629,546

(22) PCT Filed: Jul. 10, 2018

(86) PCT No.: PCT/AT2018/060142
§ 371 (c)(1),
(2) Date: Jan. 8, 2020

(87) PCT Pub. No.: WO2019/010512
PCT Pub. Date: Jan. 17, 2019

(65) Prior Publication Data
US 2020/0212863 A1 Jul. 2, 2020

(30) Foreign Application Priority Data

Jul. 10, 2017 (AT) .............................. A 50570/2017

(51) Int. Cl.
*H03G 7/00* (2006.01)
*H03F 3/181* (2006.01)
*H04R 25/00* (2006.01)

(52) U.S. Cl.
CPC .............. *H03G 7/002* (2013.01); *H03F 3/181* (2013.01); *H04R 25/356* (2013.01); *H04R 25/505* (2013.01); *H03F 2200/03* (2013.01); *H04R 2225/43* (2013.01)

(58) Field of Classification Search
USPC ......... 381/57, 94.1, 106, 120, 161, 312, 321
See application file for complete search history.

(56) References Cited

U.S. PATENT DOCUMENTS

| | | | |
|---|---|---|---|
| 5,633,937 A * | 5/1997 | Ribic | H03F 3/187 381/106 |
| 5,903,655 A * | 5/1999 | Salmi | H04R 25/356 381/321 |
| 2006/0078140 A1 | 4/2006 | Goldstein | |
| 2013/0030800 A1 | 1/2013 | Tracey et al. | |

* cited by examiner

*Primary Examiner* — Yosef K Laekemariam
(74) *Attorney, Agent, or Firm* — Dykema Gossett PLLC

(57) ABSTRACT

Various embodiments of the present disclosure are directed to modifying an input signal. In one example of a process for modifying an input signal, the process includes splitting the input signal into at least a first input part and a second input part, the amplification of at least the first input part with a linear gain to create a first output part, the nonlinear amplification of at least the second input part of the input signal to create a second output part, and summing the first output part and the second output part in order to provide an output signal.

11 Claims, 2 Drawing Sheets

METHOD TO CONTROL THE DYNAMIC RANGE OF A SIGNAL

CROSS-REFERENCE TO RELATED APPLICATIONS

This application is a national stage filing based upon International PCT Application No. PCT/AT2018/060142, filed 10 Jul. 2018, which claims priority to Austria application No. A 50570/2017, filed 10 Jul. 2017.

BACKGROUND

The present invention relates to a process for modifying an input signal, preferably an audio signal, comprising the splitting of the input signal into at least a first input part and a second input part, the amplification of at least the first input part with a linear gain to create a first output part and the nonlinear amplification of at least the second input part of the input signal to create a second output part and summing the first output part and the second output part in order to provide an output signal.

The invention also relates to a hearing-aid system comprising at least one receiving unit for receiving an input signal, preferably an audio signal, a linear amplifier and at least one nonlinear amplifier, each connected to the receiving unit to receive and amplify or modify at least parts of the electrical input signal, and also each connected to a summing unit to sum the amplified signals to produce an output signal.

In WO 98/18294 A1 hearing aids are described that balance the attack and release time to increase the intelligibility of normal speech. Therefore a linear amplification and a nonlinear amplification of the audio signal are done separately and are then combined to produce the desired output signal. By doing this, the occurrence of undesired pumping or audible gaps is decreased. The described systems can set time constants accordingly to reduce these effects. But still the described systems have problems with pumping and audible gaps and are not able to reduce them to the desired level. This causes a lack of intelligibility of spoken words. Therefore the systems still do not completely satisfy the needs of hearing-impaired individuals.

SUMMARY OF THE INVENTION

Therefore it is an objective of the invention to further decrease the probability of pumping and audible gaps. It is also an objective to do this in an automatic manner, so no time constants need to be adjusted manually and therefore to enhance the intelligibility of spoken language. The adjustment of the hearing aid should be made easier.

According to the invention, this object is met by the process according to claim 1 or by a device according to claim 8.

By using an instant amplitude signal A(t) for controlling the nonlinear amplification, the probability of audible gaps is reduced dramatically. A delay-free processing of signals is possible, but unlike other algorithms working with delay-free processing or those with a very small delay, this algorithm surprisingly does not increase the probability of pumping. This remarkable difference makes it unexpectedly attractive to use as intelligibility is strongly improved as a result. The instant amplitude signal A(t) is generated in real-time and therefore can be used directly to alter the second input part.

The linear amplification can be produced by a single amplifier or also by an array of linear amplifiers arranged in series and/or parallel. The linear gain can be adjustable. It is possible to divide the first input part into different subparts to provide different linear amplifiers for different parts of the signal. The signal can e.g. be divided by frequency to provide each linear amplifier with a defined frequency band. This can be done by filtering the first input part by frequency, e.g. via high-pass and/or low-pass filters. The gains of the linear amplifiers can be set differently.

The nonlinear amplification can also be produced by a single amplifier or also by an array of nonlinear amplifiers arranged in series or parallel. The algorithms of the nonlinear amplifiers can be chosen differently from each other. As described above for the linear amplification, each nonlinear amplifier can be provided with only a subpart of the second input part. Besides dividing the second input part by frequency another possibility could be to divide the input part by amplitude.

After the partition of the input signal into at least a first input part and a second input part has been effected, the input signal can be divided into parts of different form, for example depending on the frequency or amplitude. But if the first input part is the entire input signal and the second input part is also the entire input signal, then the whole input signal can be amplified in a linear as well as in a nonlinear manner. Therefore, no amplitude range or frequency range is lost.

It is advantageous if the amplification characteristic of the output signal in relation to the input signal comprises a first amplitude range with an essentially linear first gain, and a second amplitude range with a nonlinear gain covering lower amplitudes than the first amplitude range, whereby the gain of the second amplitude range is always higher than or as high as the first gain. This causes higher amplification of lower amplitudes and a linear amplification of higher amplitudes, which enhances the intelligibility of spoken words. Depending on the position of the second amplitude range in relation to the first amplitude range the amplification characteristics can be defined. Between the first and the second amplitude range a shifting range can be arranged with e.g. slightly smaller gain than the linear gain of the first amplitude range. But preferably the first amplitude range begins at a threshold amplitude A and the second amplitude range ends at the threshold amplitude A and threshold amplitude A is determined by an adjustment signal. A compression in the part of the signal in the second amplitude range can then change directly into a linear gain in the part of the signal in the first amplitude range. By compression, an instant gain control without time constants is meant. Therefore, this compression is not conventional, but based on the instant amplitude. The adjustment signal can determine the threshold amplitude and thereby can set the amplitude range where a compression is to be made. Therefore the adjustment signal can be changed depending on the progression of the hearing loss of the user. In a preferred embodiment, the amplification of the second input part comprises the amplification with a linear gain. This is advantageous as the additional linear gain can provide a minimum amplification for the second input part. Of course, the linear gain of this amplification could be adjustable independently from the nonlinear gain or the linear gain of the amplification of the first input part. Thus, the level of the nonlinear gain can be set. This linear amplification can take place before or after the nonlinear amplification.

If for the nonlinear amplification the second input part is divided by the sum of the instant amplitude signal A(t) and an absolute term K, division by 0 can be prevented by the term K. Also, the grade of compression can be determined by the value of term K.

If the instant amplitude signal A(t) is used to control the gain of the nonlinear amplification, a compression or expansion of the second input part can be achieved easily.

It is advantageous that the instant amplitude signal A(t) is generated by producing an analytical signal consisting of two Hilbert signals $h_1(t)$ and $h_2(t)$ with the same energy spectrum as the second input part and calculating the square root of the sum of the squares of the Hilbert-signals $h_1(t)$ and $h_2(t)$. By doing this, very fast compression of high quality can be achieved. The term "analytical signal" designates a complex signal whose imaginary component represents the Hilbert transformation of the real component. The mathematical basics are known and have been explained in detail in R. B. Randall: "Frequency Analysis", Brüel & Kjaer, 1987, for example. Due to this property, the two components of the analytical signal will be referred to in short as Hilbert signals $h_1(t)$ and $h_2(t)$. The Hilbert transformation produces from one function another function whose amplitude spectrum is identical but whose phase relation is displaced in all frequencies by π/2. Principally, it would be possible to subject the input signal to such a Hilbert transformation. This, however, is very difficult to realize in a circuit. Nevertheless it is easily possible to generate two output signals that both coincide with the input signal in the amplitude spectrum and whose phase relation to each another is displaced by π/2. The instant amplitude signal A(t) is gained by calculating the square root of the sum of the squares of the two Hilbert signals $h_1(t)$ and $h_2(t)$.

The invention further relates to a hearing-aid system where the nonlinear amplifier comprises an amplitude signal unit for producing an instant amplitude signal A(t) and a combining unit for combining the instant amplitude signal A(t) with the part of the input signal provided to the nonlinear amplifier. Said system is arranged in accordance with the invention in such a way that an amplitude signal unit is provided with which an instant amplitude signal A(t) is producible whose momentary strength is substantially proportionate to the instant amplitude of the part of the input signal provided at its input and that furthermore a combining unit is provided in which said instant amplitude signal A(t) is combined with said part of the input signal. It is preferable if the combining unit comprises a divider circuit in which the second input part can be divided by the instant amplitude signal A(t). In this way a strong reduction of the volume range is achieved. To prevent a forbidden division by zero, an adder as well as an adjustable signal source may be provided, whereby the output of the amplitude signal unit and the adjustable signal source are connected to the inputs of the adder.

In a preferable embodiment of the invention it is provided that a non-linear transformer is connected to the output of the amplitude signal unit, which transformer controls a voltage-controlled amplifier for the part of the input signal provided to the nonlinear amplifier by the receiving unit. Depending on the characteristics of the non-linear transformer it is possible to realize any desired transforming function. In combination with the non-linear transformer the voltage-controlled amplifier forms the combining unit. It may also be provided that a timer is connected in series with the non-linear transformer. Said timer, which can be a delay unit, also allows taking an influence on the slope of signal rises. Preferably, the amplitude signal unit comprises a Hilbert circuit with two outputs which are supplied with two Hilbert signals h1(t) and h2(t) gained from the part of the input signal provided to the nonlinear amplifier, which Hilbert signals represent the components of the analytical signal, and a logic circuit having two inputs connected to the outputs of the Hilbert circuit and producing an output signal A(t) according to the following algorithm from the two signals h1(t) and h2(t) that are supplied to the inputs:

$$A(t)=\sqrt{h_1^2(t)+h_2^2(t)}$$

DETAILED DESCRIPTION

Figure 1:
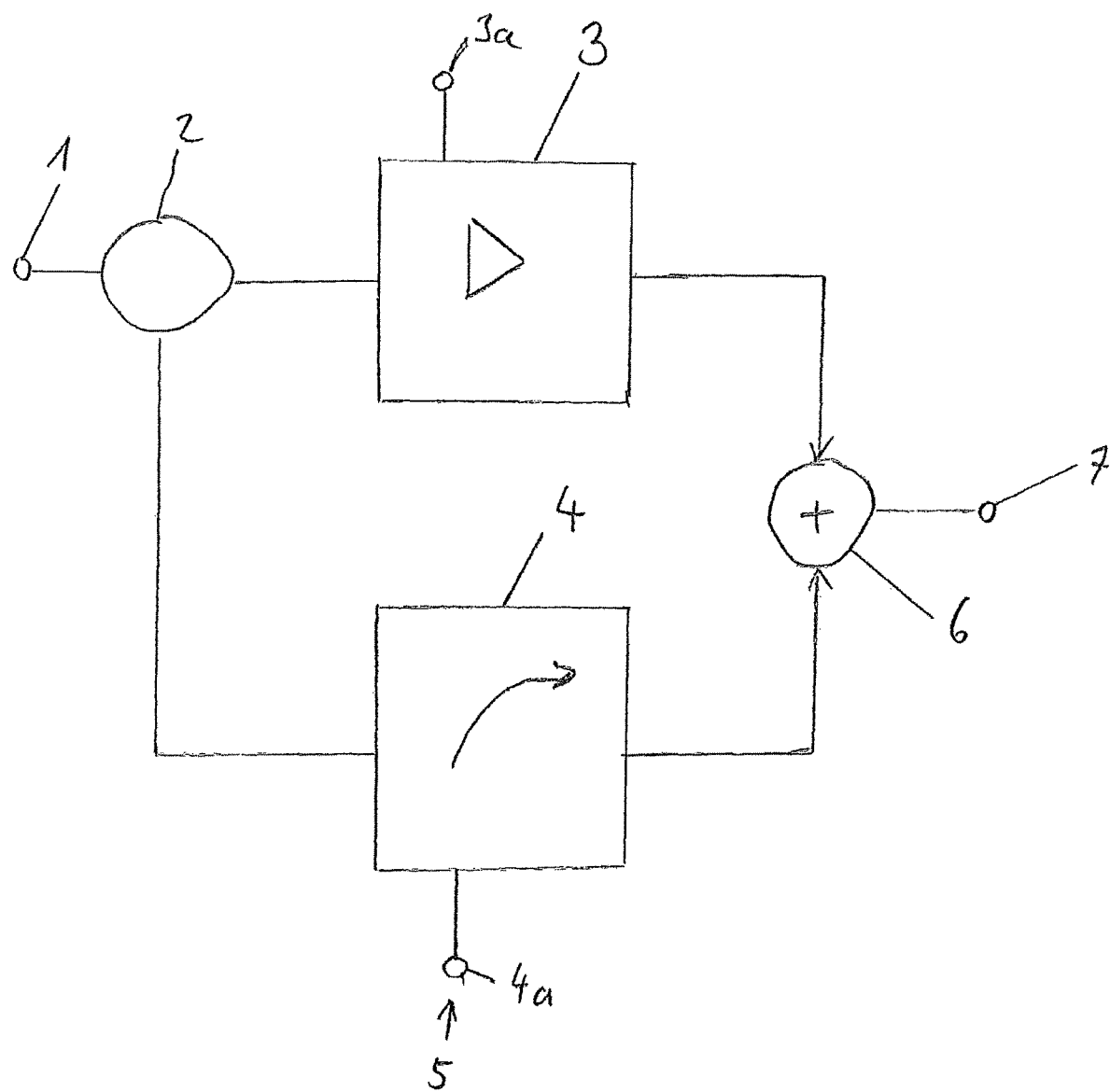
FIG. 1 is a schematic diagram of an embodiment of the invention.

In FIG. 1 a typical embodiment of the invention is shown as a schematic block diagram. An input signal can be applied to interface 1 to be provided to a receiving unit 2. The receiving unit 2 splits the input signal into a first input part and a second input part and provides the first input part to a linear amplifier 3 and the second input part to a nonlinear amplifier 4. In this embodiment, the first input part and the second input part are both the entire input signal. The linear amplifier 3 has a second input 3a to receive a signal indicating the value of the linear gain. The nonlinear amplifier 4 has a third input 4a to receive an adjustment signal 5. These signals can be provided by potentiometer that can be adjusted by the user of the hearing-aid system. The linear amplifier 3 on the basis of its inputs produces an amplified first output signal and sends it to a summing unit 6. The nonlinear amplifier 4 also produces an amplified signal on basis of its inputs, namely second output signal, which is also sent to summing unit 6. The first and second output signals are summed up to produce an output signal provided at output 7.

Figure 2:
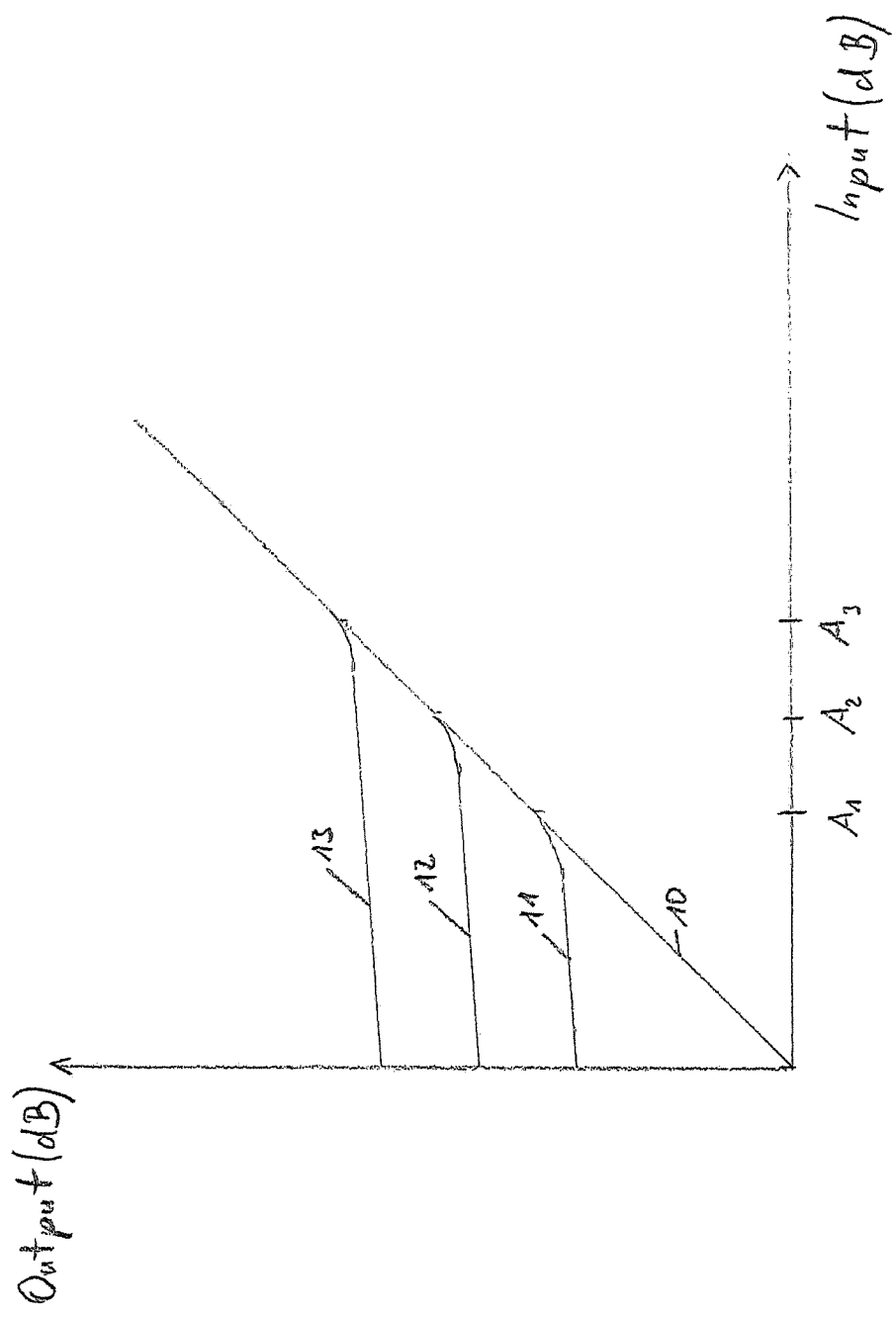
FIG. 2 is a graphic illustrating the input/output performance of a circuit like the one shown in FIG. 1 at various values of the adjustment signal.

FIG. 2 shows the interdependency of the amplitudes of the output signal and the amplitudes of the input signal. The curve describing the relationship of the amplitudes is shown in four different forms defined by four different values of the adjustment signal 5. The linear gain curve 10 describes the relationship at a linear gain, when the adjustment signal sets a threshold amplitude A to 0. No nonlinear amplification is made at this setting. At a first compression curve 11, the adjustment signal has a low value and sets a low threshold amplitude $A_1$. A compression of the signal is only made at very low amplitudes. Amplitudes above the low threshold amplitude $A_1$ are amplified with a linear gain but amplitudes below the low threshold amplitude $A_1$ are amplified with a higher gain than the linear gain and therefore can be better heard. This setting is preferred for individuals with only beginning hearing loss. A second compression curve 12 and a third compression curve 13 show the curve if a higher value or a very high value of adjustment signal 5 is set and thereby a higher threshold amplitude $A_2$ or very high threshold amplitude $A_3$ is set. These settings are advantageous for progressed hearing loss. The instant amplitude is the vector length of the analytical signal (complex, having real and imaginary part). The imaginary part is generated from the real part using Hilbert transformation. Hilbert transformation is not causal (the future must be known), and may be done only with delaying a signal, in this case you know a part of the future. The delay may not be to long (limiting the lowest frequency of such method), but up to ~20 ms it is acceptable for use in hearing aids. Now the calculation of rotating vector (Re+iIm) instant amplitude is done. There are no attack and/or decay time, and if this instant amplitude is used to control a gain in one amplifier, it is a momentary control of the "compression". Therefore, it is not a compression in conventional meaning of this term.

The invention claimed is:

1. A process for modifying an input signal comprising:
splitting the input signal into at least a first input part and a second input part;
amplification of at least the first input part with a linear gain to create a first output part;
nonlinear amplification of at least the second input part of the input signal to create a second output part; and
summing the first output part and the second output part to produce an output signal;
characterized in that for the nonlinear amplification an instant amplitude signal, correlated to the second input part, is generated and controls the nonlinear amplification, the instant amplitude signal is generated by
producing an analytical signal consisting of two Hilbert signals with the same energy spectrum as the second input part, and
calculating a square root of a sum of the squares of the two Hilbert signals;
wherein the output signal has amplification characteristic, in relation to the input signal, including
a first amplitude range begins at a threshold amplitude and has an essentially linear first gain, and
a second amplitude range that ends at the threshold amplitude, the threshold amplitude is determined by an adjustment signal, and the second amplitude range has a nonlinear gain, covering lower amplitudes than the first amplitude range, whereby the nonlinear gain of the second amplitude range is equal to or greater than the first gain.

2. The process of claim 1, characterized in that the first input part is the entire input signal and the second input part is also the entire input signal.

3. The process of claim 1, characterized in that the amplification of the second input part of the input signal includes amplification with the linear gain.

4. The process of claim 1, characterized in that the nonlinear amplification of the second input part is divided by a sum of the instant amplitude signal and an absolute term K, the result is the second output part.

5. The process of claim 1, characterized in that the instant amplitude signal controls a gain of the nonlinear amplification.

6. A hearing-aid system comprising:
at least one receiving unit for receiving an input signal;
a linear amplifier communicatively coupled to the at least one receiving unit, and configured and arranged to receive the input signal from the at least one receiving unit and to amplify the input signal;
at least one nonlinear amplifier communicatively coupled to the at least one receiving unit, the at least one nonlinear amplifier configured and arranged to receive the input signal from the at least one receiving unit and amplify or modify one or more parts of the input signal; and
a summing unit, the summing unit communicatively coupled to one or more of the at least one nonlinear amplifiers and the linear amplifier, and the summing unit is configured and arranged to sum amplified signals from the linear amplifier and the at least one nonlinear amplifier to produce an output signal;
wherein the at least one nonlinear amplifier includes
an amplitude signal unit configured and arranged to produce an instant amplitude signal, and
a combining unit configured and arranged to combine the instant amplitude signal with the input signal received by the nonlinear amplifier.

7. The hearing-aid system of claim 6, wherein the at least one nonlinear amplifier further includes
a Hilbert circuit with two outputs, the Hilbert circuit configured and arranged to produce two Hilbert signals ($h_1$, $h_2$) generated on the basis of a part of the input signal received by the Hilbert circuit, and
a fusion unit communicatively coupled to the Hilbert circuit, and configured and arranged to compute an amplifier output signal on the basis of the two Hilbert signals and in accordance with the following algorithm:

$$A(t)=\sqrt{h_1^2(t)+h_2^2(t)}$$

8. The heading-aid system of claim 6, wherein the input signal is an audio signal.

9. The process of claim 1, wherein the input signal is an audio signal.

10. The process of claim 3, wherein the nonlinear amplification of the second input part is divided by a sum of the instant amplitude signal and an absolute term K, the result is the second output part.

11. A process for modifying an input signal comprising:
splitting the input signal into at least a first input part and a second input part;
amplification of at least the first input part with a linear gain to create a first output part;
nonlinear amplification of at least the second input part of the input signal to create a second output part; and
summing the first output part and the second output part to produce an output signal;
characterized in that for the nonlinear amplification an instant amplitude signal, correlated to the second input part, is generated and controls the nonlinear amplification, the instant amplitude signal is generated by
producing an analytical signal consisting of two Hilbert signals with the same energy spectrum as the second input part, and
calculating a square root of a sum of the squares of the two Hilbert signals;
wherein the nonlinear amplification of the second input part is divided by a sum of the instant amplitude signal and an absolute term K, the result is the second output part.

* * * * *